United States Patent
Valeri et al.

(10) Patent No.: US 10,140,970 B1
(45) Date of Patent: *Nov. 27, 2018

(54) ENGINE SOUND PRODUCTION SYSTEMS AND METHODS

(71) Applicant: GM Global Technology Operations LLC, Detroit, MI (US)

(72) Inventors: Frank C. Valeri, Novi, MI (US); Scott M. Reilly, Southfield, MI (US); William Seldon, Highland, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/664,433

(22) Filed: Jul. 31, 2017

(51) Int. Cl.
| | |
|---|---|
| *B60Q 5/00* | (2006.01) |
| *G07C 5/00* | (2006.01) |
| *G07C 5/08* | (2006.01) |
| *H03G 3/24* | (2006.01) |
| *F02M 35/12* | (2006.01) |
| *G10K 15/02* | (2006.01) |

(52) U.S. Cl.
CPC ............ *G10K 15/02* (2013.01); *B60Q 5/005* (2013.01); *B60Q 5/008* (2013.01); *F02M 35/1294* (2013.01); *G07C 5/004* (2013.01); *G07C 5/0841* (2013.01); *H03G 3/24* (2013.01); *H04R 2499/13* (2013.01)

(58) Field of Classification Search
CPC .......... G10K 15/02; B60Q 5/00; B60Q 5/002; F02M 35/1294; G01D 21/00; G01D 21/02; G07C 5/004; G07C 5/008; G07C 5/0841; H03G 3/20; H03G 3/24; H04R 2499/13

USPC ........................................ 700/94; 381/58, 86
See application file for complete search history.

(56) References Cited

U.S. PATENT DOCUMENTS

| | | | | |
|---|---|---|---|---|
| 4,551,849 | A | 11/1985 | Kasai et al. | |
| 5,371,802 | A | 12/1994 | McDonald et al. | |
| 7,979,147 | B1 * | 7/2011 | Dunn | G10K 15/02 181/192 |
| 8,155,343 | B2 * | 4/2012 | Honji | G10K 15/04 381/61 |
| 8,384,528 | B2 * | 2/2013 | McCarthy | H04S 7/00 123/184.21 |
| 9,365,158 | B2 | 6/2016 | Barlow, Jr. et al. | |
| 9,694,746 | B2 * | 7/2017 | Jo | B60Q 9/00 |
| 9,899,018 | B2 | 2/2018 | Valeri et al. | |

(Continued)

FOREIGN PATENT DOCUMENTS

JP        410267745        10/1998

OTHER PUBLICATIONS

U.S. Appl. No. 14/851,627, filed Sep. 11, 2015 entitled: "Vehicle Sound Enhancement", Application.

(Continued)

*Primary Examiner* — Jesse A Elbin (57) ABSTRACT

An audio system of a vehicle includes a detection module configured to detect an occurrence of a sound when a pressure measured by an exhaust pressure sensor in an exhaust system is greater than a predetermined pressure. A sound control module is configured to, in response to the detection of the sound, increase a magnitude of a predetermined sound to be output within a passenger cabin of the vehicle. An audio driver module is configured to apply power to a speaker of the passenger cabin of the vehicle based on the predetermined sound.

20 Claims, 4 Drawing Sheets

(56) References Cited

U.S. PATENT DOCUMENTS

| | | |
|---|---|---|
| 9,990,913 B2 * | 6/2018 | Zintel .................... G10K 15/02 |
| 9,997,152 B2 * | 6/2018 | Nicolai ................... F01N 1/166 |
| 2003/0057015 A1 | 3/2003 | Helber et al. |
| 2006/0208169 A1 | 9/2006 | Breed et al. |
| 2015/0127211 A1 | 5/2015 | Hobelsberger |
| 2015/0199955 A1 * | 7/2015 | Draganic ............... G10K 15/02 |
| | | 381/86 |
| 2016/0118950 A1 | 4/2016 | Mah |
| 2016/0205472 A1 | 7/2016 | Violi et al. |

OTHER PUBLICATIONS

Non-Final Office Action dated Mar. 20, 2017, for U.S. Appl. No. 14/851,627, filed Sep. 11, 2015.

\* cited by examiner

ENGINE SOUND PRODUCTION SYSTEMS AND METHODS

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates to vehicle audio systems and methods and more particularly to audio control systems and methods for producing sounds that are naturally produced by an engine of the vehicle but may not be heard within a passenger cabin of the vehicle.

Some motor vehicles include conventional powertrains having an internal combustion engine and a drivetrain that normally emit sounds during acceleration events, deceleration events, and gear changes. Many consumers have come to rely on these normal sounds as a sign of proper vehicle function. Changes in these normal sounds may indicate, to certain consumers, that the internal combustion engine and/or the drivetrain may be functioning differently than expected.

Some consumers may have expectations as to what the normal sounds of different types of vehicle should be. For example, a consumer may expect certain sounds from "high performance" vehicles, while some sounds may not be expected from other types of vehicles. An absence of expected sounds may detract from a user's enjoyment of a vehicle.

Some motor vehicles include hybrid electric powertrains including an internal combustion engine and one or more electric motors and/or motor generator units (MGUs). Sound produced by hybrid electric powertrains may be different than the sound produced by conventional powertrains.

SUMMARY

In a feature, an audio system of a vehicle includes a detection module configured to detect an occurrence of a sound when a pressure measured by an exhaust pressure sensor in an exhaust system is greater than a predetermined pressure. A sound control module is configured to, in response to the detection of the sound, increase a magnitude of a predetermined sound to be output within a passenger cabin of the vehicle. An audio driver module is configured to apply power to a speaker of the passenger cabin of the vehicle based on the predetermined sound.

In further features, the detection module is configured to detect the occurrence of the sound when a vehicle speed is less than a predetermined speed.

In further features, a deceleration module is configured to set a deceleration signal to a first state when a vehicle speed is greater than a predetermined speed and a longitudinal acceleration of the vehicle is less than a predetermined acceleration. The predetermined acceleration is less than zero and the predetermined speed is greater than zero. The detection module is configured to detect the occurrence of the sound when the deceleration signal is in the first state.

In further features, the deceleration module is configured to set the deceleration signal to a second state when at least one of: the vehicle speed is less than the predetermined speed; and the longitudinal acceleration of the vehicle is less than the predetermined acceleration. The detection module is configured to not detect the occurrence of the sound when the deceleration signal is in the second state.

In further features, a classification module is configured to classify a type of the sound as one of: a first type of the sound; and a second type of the sound. The sound control module is configured to: select a first predetermined sound as the predetermined sound when the type of the sound is the first type of the sound; and select a second predetermined sound as the predetermined sound when the type of the sound is the second type of the sound.

In further features, the classification module is configured to classify the sound based on the pressure measured by the exhaust pressure sensor.

In further features, the classification module is configured to classify the sound based on a rate of increase (ROI) of the pressure measured by the exhaust pressure sensor.

In further features, the classification module is configured to: classify the type of the sound as the first type when the ROI of the pressure measured by the exhaust pressure sensor is greater than a predetermined ROI; and classify the type of the sound as the second type when the ROI of the pressure measured by the exhaust pressure sensor is less than the predetermined ROI.

In further features, a base module is configured to set a base ROI in the magnitude of the sound to be output within the passenger cabin of the vehicle to: a first predetermined ROI when the type of the sound is classified as the first type of the sound; and a second predetermined ROI when the type of the sound is classified as the second type of the sound. The first predetermined ROI is greater than the second predetermined ROI. The sound control module is configured to increase the magnitude of the sound to be output within the passenger cabin of the vehicle based on the base ROI.

In further features, an adjusting module is configured to produce an adjusted ROI by adjusting the base ROI based on an adjustment value. The sound control module is configured to increase the magnitude of the predetermined sound to be output within the passenger cabin of the vehicle at the adjusted ROI.

In further features, the adjusting module is configured to set the adjusted ROI based on one of: a sum of the adjustment value and the base ROI; and a product of the adjustment value and the base ROI.

In further features, an adjustment module is configured to: set the adjustment value to a first predetermined value when a driver selected mode is a first mode; and set the adjustment value to a second predetermined value when the driver selected mode is a second mode.

In further features, a learning module is configured to set the adjustment value based on a difference between: the base ROI; and an ROI in sound within the passenger cabin measured using a microphone within the passenger cabin.

In further features, an adjustment module is configured to: set the adjustment value to a first predetermined value when an opening of an aperture of the passenger cabin is a first opening; and set the adjustment value to a second predetermined value when the opening of the aperture of the passenger cabin is a second opening. The first predetermined value is greater than the second predetermined value, and the first opening is less than the second opening.

In further features, an adjusting module is configured to produce an adjusted ROI by adjusting the base ROI based on a first adjustment value and a second adjustment value. The sound control module is configured to increase the magnitude of the predetermined sound to be output within the passenger cabin of the vehicle at the adjusted ROI. An adjustment module is configured to: set the first adjustment value to a first predetermined value when a driver selected mode is a first mode; and set the first adjustment value to a second predetermined value when the driver selected mode is a second mode. A learning module is configured to set the second adjustment value based on a difference between: the base ROI; and an ROI in sound within the passenger cabin measured using a microphone within the passenger cabin.

In further features, the audio driver module is configured to increase power applied to the speaker in response to the increase in the magnitude.

In a feature, a method of controlling audio within a vehicle includes: detecting an occurrence of a sound when a pressure measured by an exhaust pressure sensor in an exhaust system is greater than a predetermined pressure; in response to the detection of the sound, increasing a magnitude of a predetermined sound to be output within a passenger cabin of the vehicle; and applying power to a speaker of the passenger cabin of the vehicle based on the predetermined sound.

In further features, the method further includes: classifying a type of the sound as one of: a first type of the sound; and a second type of the sound; selecting a first predetermined sound as the predetermined sound when the type of the sound is the first type of the sound; and selecting a second predetermined sound as the predetermined sound when the type of the sound is the second type of the sound.

In further features, the classifying includes classifying the sound based on the pressure measured by the exhaust pressure sensor.

In further features, the classifying includes classifying the sound based on a rate of increase (ROI) of the pressure measured by the exhaust pressure sensor.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Internal combustion engines of vehicles combust air and fuel within cylinders. During vehicle deceleration at positive vehicle speeds, the engine may emit natural sounds, such as pop sounds and burble sounds when fuel combusts within an exhaust system of the vehicle. Some vehicles, such as performance luxury vehicles, may include one or more sound damping devices that attenuate or minimize the sound of the natural pops and burbles heard within a passenger cabin of the vehicle.

According to the present disclosure, an audio control module of the vehicle outputs sound within the passenger cabin via one or more speakers, such as during a deceleration event, to replicate the natural pop sounds. The audio control module identifies the presence of pops based on exhaust pressure within an exhaust system. The audio control module generates sound based on the exhaust pressure and sound within the passenger cabin received via one or more microphones. This aurally provides the driver with the natural pop sounds produced by the engine and may increase the aural experience of the driver.

Figure 1:
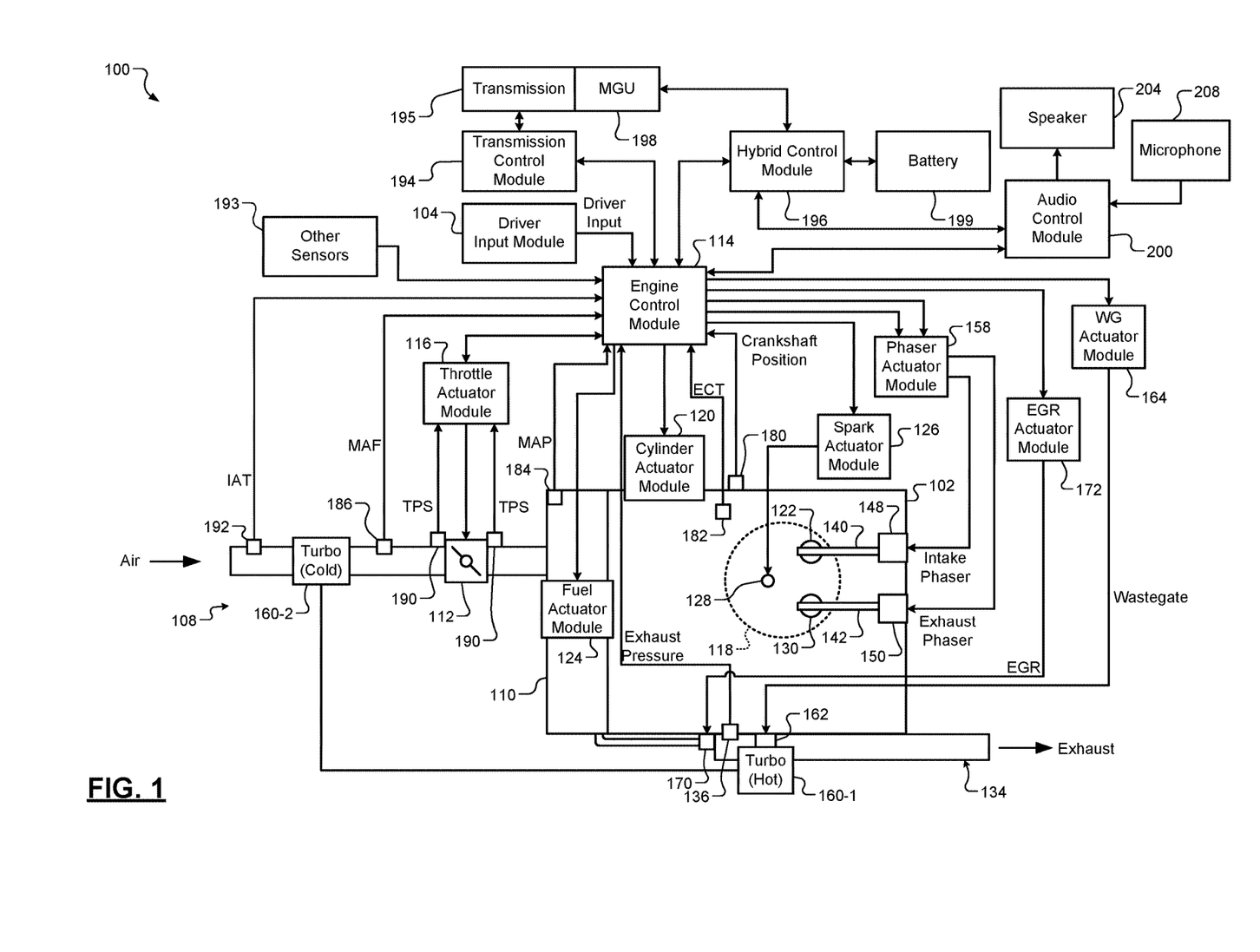
FIG. 1 is a functional block diagram of an vehicle system.

Referring now to FIG. 1, a functional block diagram of an example vehicle system 100 is presented. A vehicle includes an engine 102 that combusts an air/fuel mixture to produce torque. The vehicle may be non-autonomous, semi-autonomous, or autonomous.

Air is drawn into the engine 102 through an intake system 108. The intake system 108 may include an intake manifold 110 and a throttle valve 112. For example only, the throttle valve 112 may include a butterfly valve having a rotatable blade. An engine control module (ECM) 114 controls a throttle actuator module 116, and the throttle actuator module 116 regulates opening of the throttle valve 112 to control airflow into the intake manifold 110.

Air from the intake manifold 110 is drawn into cylinders of the engine 102. While the engine 102 includes multiple cylinders, for illustration purposes a single representative cylinder 118 is shown. For example only, the engine 102 may include 2, 3, 4, 5, 6, 8, 10, and/or 12 cylinders. The ECM 114 may instruct a cylinder actuator module 120 to selectively deactivate some of the cylinders under some circumstances, as discussed further below, which may improve fuel efficiency.

The engine 102 may operate using a four-stroke cycle or another suitable engine cycle. The four strokes of a four-stroke cycle, described below, will be referred to as the intake stroke, the compression stroke, the combustion stroke, and the exhaust stroke. During each revolution of a crankshaft (not shown), two of the four strokes occur within the cylinder 118. Therefore, two crankshaft revolutions are necessary for the cylinder 118 to experience all four of the strokes. For four-stroke engines, one engine cycle may correspond to two crankshaft revolutions.

When the cylinder 118 is activated, air from the intake manifold 110 is drawn into the cylinder 118 through an intake valve 122 during the intake stroke. The ECM 114 controls a fuel actuator module 124, which regulates fuel injection to achieve a desired air/fuel ratio. Fuel may be injected into the intake manifold 110 at a central location or at multiple locations, such as near the intake valve 122 of each of the cylinders. In various implementations (not shown), fuel may be injected directly into the cylinders or into mixing chambers/ports associated with the cylinders. The fuel actuator module 124 may halt injection of fuel to cylinders that are deactivated.

The injected fuel mixes with air and creates an air/fuel mixture in the cylinder 118. During the compression stroke, a piston (not shown) within the cylinder 118 compresses the air/fuel mixture. The engine 102 may be a compression-ignition engine, in which case compression causes ignition of the air/fuel mixture. Alternatively, the engine 102 may be a spark-ignition engine, in which case a spark actuator module 126 energizes a spark plug 128 in the cylinder 118 based on a signal from the ECM 114, which ignites the air/fuel mixture. Some types of engines, such as homogenous charge compression ignition (HCCI) engines may perform both compression ignition and spark ignition. The timing of the spark may be specified relative to the time when the piston is at its topmost position, which will be referred to as top dead center (TDC).

The spark actuator module 126 may be controlled by a timing signal specifying how far before or after TDC to generate the spark. Because piston position is directly related to crankshaft rotation, operation of the spark actuator module 126 may be synchronized with the position of the crankshaft. The spark actuator module 126 may disable provision of spark to deactivated cylinders or provide spark to deactivated cylinders.

During the combustion stroke, the combustion of the air/fuel mixture drives the piston down, thereby driving the crankshaft. The combustion stroke may be defined as the time between the piston reaching TDC and the time when the piston returns to a bottom most position, which will be referred to as bottom dead center (BDC).

During the exhaust stroke, the piston begins moving up from BDC and expels the byproducts of combustion through an exhaust valve 130. The byproducts of combustion are exhausted from the vehicle via an exhaust system. An exhaust pressure sensor 136 measures an exhaust pressure within the exhaust system 134. For example, the exhaust pressure sensor 136 may measure the exhaust pressure within an exhaust manifold, in an exhaust conduit near the exhaust manifold, or in another location in the exhaust system 134.

The intake valve 122 may be controlled by an intake camshaft 140, while the exhaust valve 130 may be controlled by an exhaust camshaft 142. In various implementations, multiple intake camshafts (including the intake camshaft 140) may control multiple intake valves (including the intake valve 122) for the cylinder 118 and/or may control the intake valves (including the intake valve 122) of multiple banks of cylinders (including the cylinder 118). Similarly, multiple exhaust camshafts (including the exhaust camshaft 142) may control multiple exhaust valves for the cylinder 118 and/or may control exhaust valves (including the exhaust valve 130) for multiple banks of cylinders (including the cylinder 118). While camshaft based valve actuation is shown and has been discussed, camless valve actuators may be implemented. While separate intake and exhaust camshafts are shown, one camshaft having lobes for both the intake and exhaust valves may be used.

The cylinder actuator module 120 may deactivate the cylinder 118 by disabling opening of the intake valve 122 and/or the exhaust valve 130. The time when the intake valve 122 is opened may be varied with respect to piston TDC by an intake cam phaser 148. The time when the exhaust valve 130 is opened may be varied with respect to piston TDC by an exhaust cam phaser 150. A phaser actuator module 158 may control the intake cam phaser 148 and the exhaust cam phaser 150 based on signals from the ECM 114. In various implementations, cam phasing may be omitted. Variable valve lift (not shown) may also be controlled by the phaser actuator module 158. In various other implementations, the intake valve 122 and/or the exhaust valve 130 may be controlled by actuators other than a camshaft, such as electromechanical actuators, electrohydraulic actuators, electromagnetic actuators, etc.

The engine 102 may include zero, one, or more than one boost device that provides pressurized air to the intake manifold 110. For example, FIG. 1 shows a turbocharger including a turbocharger turbine 160-1 that is driven by exhaust gases flowing through the exhaust system 134. A supercharger is another type of boost device.

The turbocharger also includes a turbocharger compressor 160-2 that is driven by the turbocharger turbine 160-1 and that compresses air leading into the throttle valve 112. A wastegate 162 controls exhaust flow through and bypassing the turbocharger turbine 160-1. Wastegates can also be referred to as (turbocharger) turbine bypass valves. The wastegate 162 may allow exhaust to bypass the turbocharger turbine 160-1 to reduce intake air compression provided by the turbocharger. The ECM 114 may control the turbocharger via a wastegate actuator module 164. The wastegate actuator module 164 may modulate the boost of the turbocharger by controlling an opening of the wastegate 162.

A cooler (e.g., a charge air cooler or an intercooler) may dissipate some of the heat contained in the compressed air charge, which may be generated as the air is compressed. Although shown separated for purposes of illustration, the turbocharger turbine 160-1 and the turbocharger compressor 160-2 may be mechanically linked to each other, placing intake air in close proximity to hot exhaust. The compressed air charge may absorb heat from components of the exhaust system 134.

The engine 102 may include an exhaust gas recirculation (EGR) valve 170, which selectively redirects exhaust gas back to the intake manifold 110. The EGR valve 170 may receive exhaust gas from upstream of the turbocharger turbine 160-1 in the exhaust system 134. The EGR valve 170 may be controlled by an EGR actuator module 172.

Crankshaft position may be measured using a crankshaft position sensor 180. An engine speed may be determined based on the crankshaft position measured using the crankshaft position sensor 180. A temperature of engine coolant may be measured using an engine coolant temperature (ECT) sensor 182. The ECT sensor 182 may be located within the engine 102 or at other locations where the coolant is circulated, such as a radiator (not shown).

A pressure within the intake manifold 110 may be measured using a manifold absolute pressure (MAP) sensor 184. In various implementations, engine vacuum, which is the difference between ambient air pressure and the pressure within the intake manifold 110, may be measured. A mass flow rate of air flowing into the intake manifold 110 may be measured using a mass air flow (MAF) sensor 186. In various implementations, the MAF sensor 186 may be located in a housing that also includes the throttle valve 112.

Position of the throttle valve 112 may be measured using one or more throttle position sensors (TPS) 190. A temperature of air being drawn into the engine 102 may be measured using an intake air temperature (IAT) sensor 192. One or more other sensors 193 may also be implemented. The other sensors 193 include an accelerator pedal position (APP) sensor, a brake pedal position (BPP) sensor, may include a clutch pedal position (CPP) sensor (e.g., in the case of a manual transmission), and may include one or more other types of sensors. An APP sensor measures a position of an accelerator pedal within a passenger cabin of the vehicle. A BPP sensor measures a position of a brake pedal within a passenger cabin of the vehicle. A CPP sensor may measure a position of a clutch pedal within the passenger cabin of the vehicle. The other sensors 193 may also include one or more acceleration sensors that measure longitudinal (e.g., fore/aft) acceleration of the vehicle and latitudinal acceleration of the vehicle. An accelerometer is an example type of acceleration sensor, although other types of acceleration sensors may be used. The ECM 114 may use signals from the sensors to make control decisions for the engine 102.

The ECM 114 may communicate with a transmission control module 194, for example, to coordinate engine operation with gear shifts in a transmission 195. The ECM 114 may communicate with a hybrid control module 196, for example, to coordinate operation of the engine 102 and a motor generator unit (MGU) 198. While the example of one MGU is provided, multiple MGUs and/or electric motors may be implemented. The terms MGU and electric motor may be interchangeable in the context of the present application, drawings, and claims. In various implementations, various functions of the ECM 114, the transmission control module 194, and the hybrid control module 196 may be integrated into one or more modules.

Each system that varies an engine parameter may be referred to as an engine actuator. Each engine actuator has an associated actuator value. For example, the throttle actuator module 116 may be referred to as an engine actuator, and the throttle opening area may be referred to as the actuator value. In the example of FIG. 1, the throttle actuator module 116 achieves the throttle opening area by adjusting an angle of the blade of the throttle valve 112.

The spark actuator module 126 may also be referred to as an engine actuator, while the corresponding actuator value may be the amount of spark advance, for example, relative to cylinder TDC. Other engine actuators may include the cylinder actuator module 120, the fuel actuator module 124, the phaser actuator module 158, the wastegate actuator module 164, and the EGR actuator module 172. For these engine actuators, the actuator values may correspond to a cylinder activation/deactivation sequence, fueling rate, intake and exhaust cam phaser angles, target wastegate opening, and EGR valve opening, respectively.

The ECM 114 may control the actuator values in order to cause the engine 102 to output torque based on a torque request. The ECM 114 may determine the torque request, for example, based on one or more driver inputs, such as an APP, a BPP, a CPP, and/or one or more other suitable driver inputs. The ECM 114 may determine the torque request, for example, using one or more functions or lookup tables that relate the driver input(s) to torque requests.

Under some circumstances, the hybrid control module 196 controls the MGU 198 to output torque, for example, to supplement engine torque output. The hybrid control module 196 may also control the MGU 198 to output torque for vehicle propulsion at times when the engine 102 is shut down.

The hybrid control module 196 applies electrical power from a battery 199 to the MGU 198 to cause the MGU 198 to output positive torque. While the example of the battery 199 is provided, more than one battery may be used to supply power to the MGU 198. The MGU 198 may output torque, for example, to the engine 102, to an input shaft of the transmission 195, to an output shaft of the transmission 195, or to another torque transfer device of the powertrain of the vehicle. The battery 199 may be dedicated for the MGU 198 and one or more other batteries may supply power for other vehicle functions.

Under other circumstances, the hybrid control module 196 may control the MGU 198 to convert mechanical energy of the vehicle into electrical energy. The hybrid control module 196 may control the MGU 198 to convert mechanical energy into electrical energy, for example, to recharge the battery 199. This may be referred to as regeneration.

The vehicle also includes an audio control module 200 that controls sound output via one or more speakers 204 within the passenger cabin of the vehicle. The audio control module 200 may control the speakers 204 to output sound based on received amplitude modulation (AM) signals, received frequency modulation (FM) signals, received satellite signals, and other types of audio signals. The audio control module 200 may be implemented, for example, with an infotainment system.

Under some circumstances, such as during deceleration, the audio control module 200 additionally or alternatively controls the sound output via the speakers 204. As discussed above, some vehicles may include one or more sound damping devices that attenuate or eliminate natural sounds (e.g., popping and/or burbling) of the engine 102 that a driver may expect during deceleration. The audio control module 200 may control sound output via the speakers 204 to replicate some of the normal sounds that the driver may expect, such as during deceleration.

The audio control module 200 may receive parameters from the ECM 114, the hybrid control module 196, the transmission control module 194, and/or one or more other control modules of the vehicle. The audio control module 200 may receive parameters from other modules via a network, such as a controller area network (CAN) bus or another suitable type of network. In vehicles, CAN may also stand for car area network.

The audio control module 200 may also receive one or more inputs directly, such as from a microphone 208 within the passenger cabin of the vehicle. The microphone 208 may be implemented, for example, with the infotainment system. While the example of one microphone is provided, the present disclosure is also applicable to two or more microphones. As discussed further below, the audio control module 200 may determine when and the extent to which to output sound during deceleration based on one or more of the received parameters.

Figure 2:
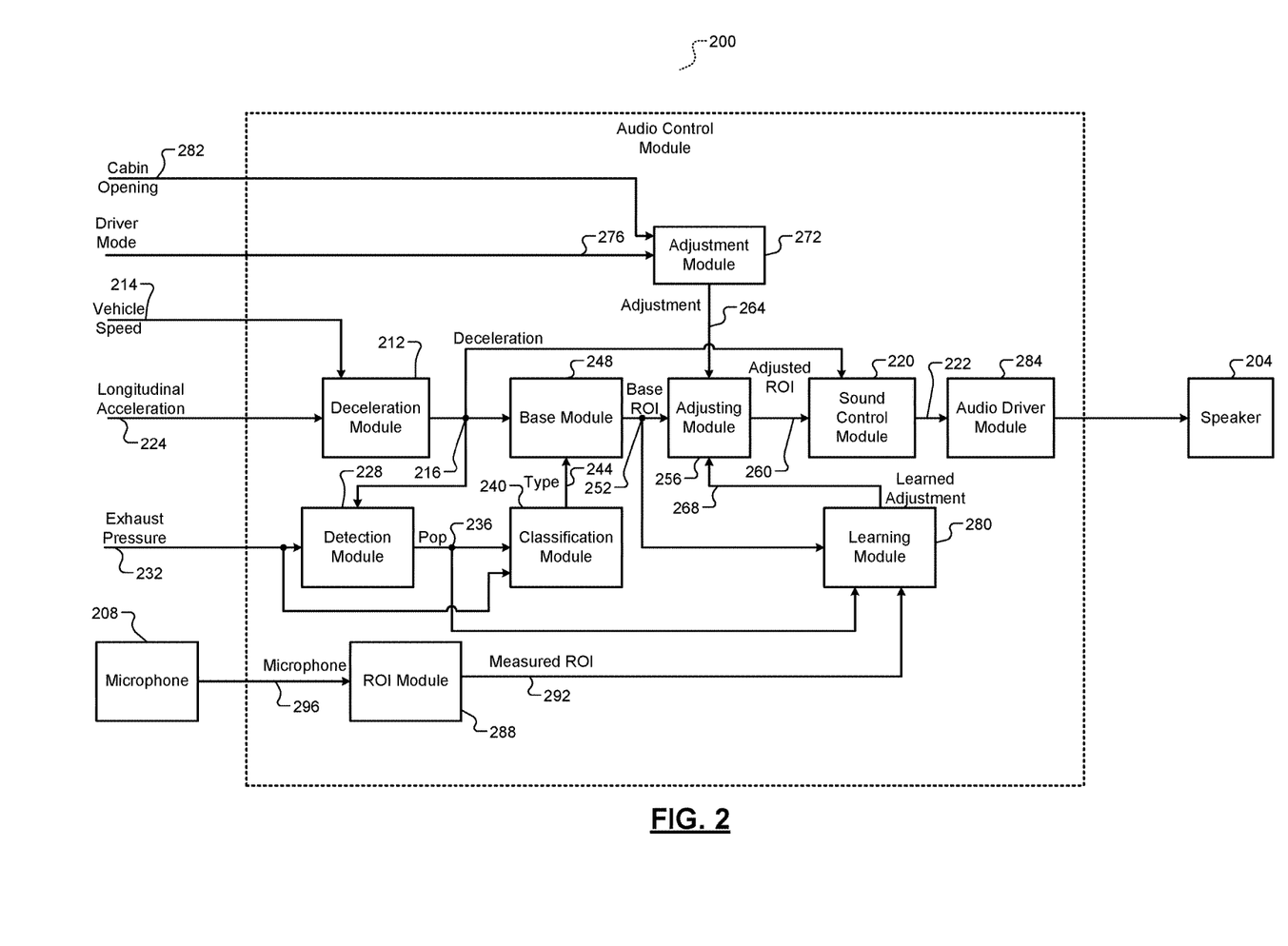
FIG. 2 is a functional block diagram of an example audio system including an audio control module and speakers.
Figure 3:
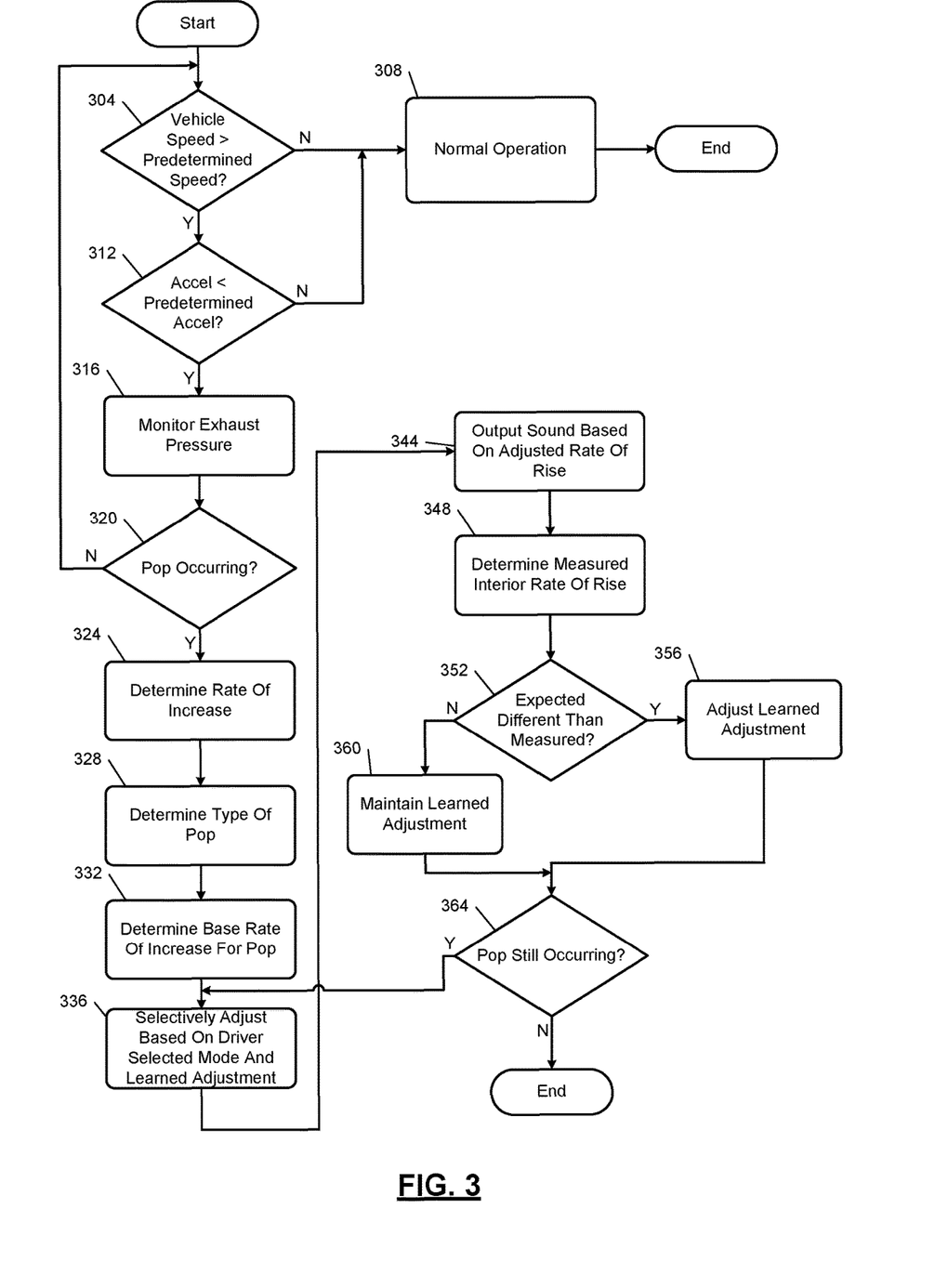
FIG. 3 is a flowchart depicting an example method of generating sound within the vehicle based on exhaust pressure.

FIG. 2 is a functional block diagram of an example audio system including the audio control module 200 and the speakers 204. The speakers 204 output sound within the passenger cabin of the vehicle. FIG. 3 is a flowchart depicting an example method of generating sound during deceleration events. FIGS. 2 and 3 will now be described collectively where reference numerals beginning with 2 (e.g., 216, 220, etc.) refer to FIG. 2 while reference numerals beginning with 3 (e.g., 304, 308, 312, etc.) refer to FIG. 3.

Control begins with 304 where a deceleration module 212 determines whether a vehicle speed 214 is greater than a predetermined speed. If 304 is false, the deceleration module 212 sets a deceleration signal 216 to a first state and transfer to 308 for normal mode operation, and control may end. When the deceleration signal 216 is in the first state, a sound control module 220 may set characteristics 222 of sound to be output via the speakers 204 based on normal operation. If 304 is true, control continues with 312. The predetermined speed may be calibratable and is a positive value. For example only, the predetermined speed may be greater than or equal to approximately 50 miles per hour (mph), 60 mph, 70 mph, 80 mph, 90 mph, or another suitable speed.

The vehicle speed 214 may be determined based on one or more wheel speeds of the vehicle measured using wheel speed sensor(s), respectively. For example, the ECM 114 may determine the vehicle speed 214 based on an average of two or more of the wheel speeds. The audio control module 200 may receive the vehicle speed 214, for example, via the network.

At 312, the deceleration module 308 may determine whether a longitudinal acceleration 224 of the vehicle (e.g., in the forward direction) is less than (i.e., more negative than) a predetermined acceleration. The predetermined acceleration may be calibratable and is a negative value (i.e., indicative of vehicle deceleration in the forward direction). The predetermined acceleration may be, for example, approximately −0.2 g or another suitable value. If 312 is true, the deceleration module 212 sets the deceleration signal 216 to a second state, and control continues with 316. If 312 is false, the deceleration module 212 sets the deceleration signal 216 to the first state, and control may transfer to 308 for normal mode operation, as discussed above.

The longitudinal acceleration 224 of the vehicle may be measured using one or more longitudinal acceleration sensors. The audio control module 200 may receive the longitudinal acceleration 224, for example, from the ECM 114, the transmission control module 194, or another module via the network.

The deceleration signal 216 being in the first state indicates that a deceleration event is not occurring. The deceleration signal 216 being in the second state indicates that a deceleration event is occurring. The engine 102 may naturally produce pop sounds when a deceleration event is occurring. The engine 102 may also naturally produce pop sounds under other conditions. The pop sounds correspond to exhaust pressure rises resulting from combustion of fuel within the exhaust system 134. When the deceleration signal 216 is in the second state, the sound control module 220 set the characteristics 222 of sound to be output via the speakers 204 to include pop sounds corresponding to the pop sounds that the engine 102 produces. As discussed above, the pop sounds may not be heard or heard to a lesser extent within the passenger cabin of the vehicle due to the vehicle including one or more sound damping devices that prevent or minimize the pop sounds within the passenger cabin of the vehicle.

The engine 102 may also produce pop sounds under other circumstances than deceleration events. For example, the engine 102 may produce pop sounds when the engine 102 is revved, such as while the vehicle is stopped or moving slowly or while the transmission 195 is not imposing a load on the engine 102. While the example of deceleration is discussed herein, the present disclosure is also applicable to generation of sound for other events when pops occur.

When the deceleration signal 216 is in the second state, a detection module 228 is enabled, monitors an exhaust pressure 232 measured by the exhaust pressure sensor 136, and detects the occurrence of pop sounds based on the exhaust pressure 232. When the deceleration signal 216 is in the first state, the detection module 228 may be disabled and may not monitor the exhaust pressure 232 for pop sounds. In various implementations, the detection module 228 may be enabled and monitor the exhaust pressure 232 when one or more other conditions are present when pop sounds may occur or continuously.

Figure 4:
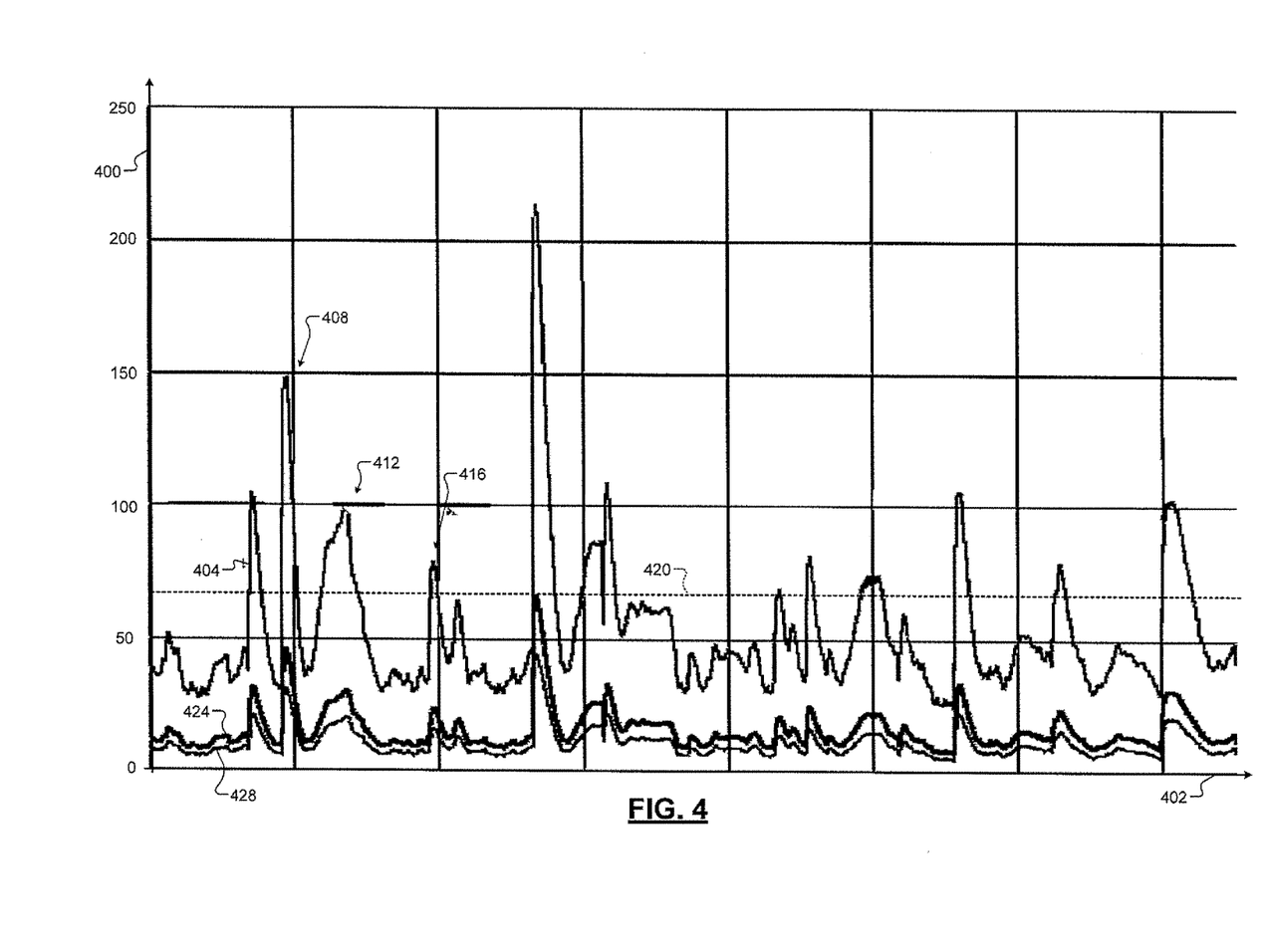
FIG. 4 includes example graph of magnitude of sound and exhaust pressure versus time during a deceleration event.

FIG. 4 includes an example graph of magnitude 400 versus time 402. Trace 404 tracks the exhaust pressure 232 and includes multiple exhaust pressure rises indicative of pops, such as at 408, 412, 416, and others.

Referring again to FIGS. 2 and 3, at 320 the detection module 228 determines whether a pop is occurring. For example, the detection module 228 may determine that a pop is occurring when the exhaust pressure 232 is increasing and is greater than a predetermined pressure. The detection module 228 may determine that a pop is not occurring when at least one of the exhaust pressure 232 is not increasing and the exhaust pressure 232 is not greater than the predetermined pressure. The predetermined pressure is greater than zero and may be calibratable. An example predetermined pressure is illustrated by 420 in FIG. 4.

The detection module 228 generates a pop signal 236 that indicates whether a pop is occurring. For example, the detection module 228 may set the pop signal 236 to a first state when a pop is not occurring. The detection module 228 may set the pop signal 236 to a second state when a pop is occurring.

When the pop signal 236 is in the first state, a classification module 240 is disabled. The classification module 240 is enabled when the pop signal 236 is in the second state. In other words, the detection module 228 disables the classification module 240 when a pop is not occurring and enables the classification module 240 when a pop is occurring.

When a pop is occurring, the classification module 240 determines a type 244 of the pop. Different types of pop sounds may have different exhaust pressure characteristics. For example, each different type of pop sound may have a different rate of increase (ROI) of the exhaust pressure 232. The classification module 240 determines the type 244 of the pop that is occurring based on the exhaust pressure 232.

For example, at 324, the classification module 240 determines the ROI of the exhaust pressure 232. For example, the classification module 240 may set the ROI of the exhaust pressure 232 based on the present (current) value of the exhaust pressure 232 minus a previous (e.g., last) value of the exhaust pressure 232.

At 328, the classification module 240 determines the type 244 of the pop that is occurring based the ROI of the exhaust pressure 232. For example, when the ROI of the exhaust pressure 232 is greater than a first predetermined ROI, the classification module 240 may set the type 244 to a first predetermined type of pop (e.g., a first state). 408 in FIG. 4 is an example of the first predetermined type of pop. When the ROI of the exhaust pressure 232 is less than a second predetermined ROI, the classification module 240 may set the type 244 to a second predetermined type of pop (e.g., a second state). 412 in FIG. 4 is an example of the second predetermined type of pop. The second predetermined ROI is less than the first predetermined ROI. When the ROI of the exhaust pressure 232 is less than the first predetermined ROI and greater than the second predetermined ROI, the classification module 240 may set the type 244 to a third predetermined type of pop (e.g., a third state). 416 in FIG. 4 is an example of the third predetermined type of pop.

As illustrated in FIG. 4, each predetermined type of pop has unique exhaust pressure characteristics. At 332, a base module 248 determines a base ROI 252 for generating sound within the passenger cabin for the pop that is occurring based on the type 244 of the pop. For example, the base module 248 sets the base ROI 252 to a third predetermined ROI when the type 244 is set to the first predetermined type of pop (e.g., the first state). The base module 248 sets the base ROI 252 to a fourth predetermined ROI when the type 244 is set to the second predetermined type of pop (e.g., the second state). The base module 248 sets the base ROI 252 to a fifth predetermined ROI when the type 244 is set to the third predetermined type of pop (e.g., the third state). The third predetermined ROI is greater than the fourth predetermined ROI and the fifth predetermined ROI. The fourth predetermined ROI is less than the fifth predetermined ROI.

At 336, an adjusting module 256 selectively adjusts the base ROI 252 for the pop that is occurring to produce an adjusted ROI 260 for generating sound within the passenger cabin for the pop that is occurring. The adjusting module 256 adjusts the base ROI 252 based on an adjustment value 264 and a learned adjustment value 268. The adjusting module 256 may, for example, multiply or add the adjustment value 264 with or to the base ROI 252. The adjusting module 256 may multiply or add the learned adjustment value 268 with or to the base ROI 252. Alternatively, the adjusting module 256 may multiply or add the learned adjustment value 268 with or to the result of the adjustment of the base ROI 252 based on the mode adjustment value 264.

An adjustment module 272 determines the adjustment value 264 based on a driver selected mode 276. At a given time, the driver selected mode 276 may be one of, for example, sport, normal, economy, and another mode. The driver selected mode 276 may be set, for example, based on user input to one or more user input devices.

The adjustment module 272 sets the adjustment value 264 to a predetermined value associated with the specific setting of the driver selected mode 276 at that time. For example, the adjustment module 272 sets the adjustment value 264 to a first predetermined value when the driver selected mode 276 is set to the sport mode. The adjustment module 272 sets the adjustment value 264 to a second predetermined value when the driver selected mode 276 is set to the normal mode. The adjustment module 272 sets the adjustment value 264 to a third predetermined value when the driver selected mode 276 is set to the economy mode. The predetermined values increase as aggressiveness of the driver selected mode 276 increases and vice versa. For example, the first predetermined value (for the sport mode) is greater than the second predetermined value (for the normal mode), and the second predetermined value is greater than the first predetermined value (for the economy mode). A learning module 280 determines the learned adjustment value 268, as discussed further below.

Additionally or alternatively to the driver selected mode 276, the adjustment module 272 may determine the adjustment value 264 based on a cabin opening 282. The cabin opening 282 may correspond to an opening of one or more apertures of the passenger cabin of the vehicle. Examples of apertures of the passenger cabin include, for example, windows, openable roofs, convertible tops, removable tops, doors (e.g., side and rear), and foldable rear seats of the vehicle. The cabin opening 282 may increase as opening of one or more apertures of the passenger cabin increase and vice versa. As the cabin opening 282 increases, the driver may be more able to hear the natural pop sounds produced by the engine 102 and vice versa.

The adjustment module 272 may, for example, determine the adjustment value 264 based on the cabin opening 282 using a lookup table of adjustment values indexed by cabin opening. As another example, the adjustment module 272 may set the adjustment value 264 to a first predetermined value when the cabin opening 282 is less than a predetermined value and to a second predetermined value when the cabin opening 282 is greater than the predetermined value. While the example of one predetermined value is discussed, the adjustment module 272 may set the adjustment value 264 based on the cabin opening 282 relative to two or more predetermined values.

In the example of use of the cabin opening 282 in addition to the driver selected mode 276, the adjustment module 272 may adjust the adjustment value 264 (determined based on the driver selected mode 276) based on the cabin opening 282. Generally, the adjustment module 272 may decrease the adjustment value 264 as the cabin opening 282 increases. The adjustment module 272 may increase the adjustment value 264 as the cabin opening 282 decreases.

At 344, the sound control module 220 sets the characteristics 222 to increase a magnitude of a predetermined pop sound to be output via the speakers 204 according to the adjusted ROI 260. This is to generate sound within the passenger cabin based on the pop that is occurring. The sound control module 220 may select the predetermined pop sound from a group of predetermined pop sounds stored in memory based on the type 244 of the pop. For example, the sound control module 220 selects a first predetermined pop sound when the type 244 is the first type of pop. The sound control module 220 selects a second predetermined pop sound when the type 244 is the second type of pop. The sound control module 220 selects a third predetermined pop sound when the type 244 is the third type of pop. The sound control module 220 may also generate the characteristics 222 to include one or more other sounds, for example, for sound enhancement, sound masking, etc. Alternatively, the same predetermined pop sound may be used for each of the different types of pop. An audio driver module 284 applies power (e.g., from the one or more other batteries) to the speakers 204 to output sound according to the characteristics 222.

In FIG. 4, example trace 424 tracks magnitude of sound within the passenger cabin based on the adjusted ROI 260. Example trace 428 tracks magnitude of sound within the passenger cabin based on the base ROI 252.

At 348, an ROI module 288 determines a measured ROI 292 of sound within the passenger cabin based on input 296 (e.g., magnitude) from the one or more microphones 208. For example, the classification module 240 may set the measured ROI 292 based on the present (current) value of the input 296 from the microphone(s) 208 minus a previous (e.g., last) value of the input 296 from the microphone(s) 208.

At 352, the learning module 280 may determine a difference between the base ROI 252 and the measured ROI 292. The learning module 280 may also determine whether the difference is outside of a range of predetermined values or whether a magnitude of the difference is greater than a predetermined value. If 352 is true, the learning module 280 may adjust (e.g., increase or decrease) the learned adjustment value 268 based on the difference at 356, and control continues with 364. For example, the learning module 280 may set the learned adjustment value 268 based on or equal to a sum of the difference and the last value of the learned adjustment value 268. The learning module 280 may initialize the learned adjustment value 268 to a predetermined initialization value when the detection module 228 detects the pop (e.g., when the pop signal 236 transitions from the first state to the second state). If 352 is false, the learning module 280 may leave the learned adjustment value 268 unchanged (i.e., maintain the learned adjustment value 268) at 360, and control continues with 364.

At 364, the detection module 228 may determine whether the pop is still occurring. For example, the detection module 228 may determine whether the exhaust pressure 232 is increasing (e.g., whether the ROI in the exhaust pressure is greater than zero). The detection module 228 may determine that a pop is not occurring when the exhaust pressure 232 is not increasing. If 364 is true, control transfers to 336. If 364 is false, the sound control module 220 may generate the characteristics 222 to stop generating sound for the pop, and control may end. While the example of FIG. 3 illustrates one control loop, control may return to 304.

Outputting pop sound during deceleration events may replicate the pop sounds produced by the engine 102 that the driver may expect to hear during deceleration, despite the fact that the pop sounds produced by the engine 102 may not be attenuated by the sound damping device(s). This may increase the driver's aural experience.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP:

Hypertext Preprocessor), Scala, Eiffel, Smalltalk, Erlang, Ruby, Flash®, Visual Basic®, Lua, MATLAB, SIMULINK, and Python®.

None of the elements recited in the claims are intended to be a means-plus-function element within the meaning of 35 U.S.C. § 112(f) unless an element is expressly recited using the phrase "means for," or in the case of a method claim using the phrases "operation for" or "step for."

What is claimed is:

1. An audio system of a vehicle, comprising:
    a detection module configured to detect an occurrence of a sound when a pressure measured by an exhaust pressure sensor in an exhaust system is greater than a predetermined pressure;
    a sound control module configured to, in response to the detection of the sound, increase a magnitude of a predetermined sound to be output within a passenger cabin of the vehicle; and
    an audio driver module configured to apply power to a speaker of the passenger cabin of the vehicle based on the predetermined sound.

2. The audio system of claim 1 wherein the detection module is configured to detect the occurrence of the sound when a vehicle speed is less than a predetermined speed.

3. The audio system of claim 1 further comprising:
    a deceleration module configured to set a deceleration signal to a first state when a vehicle speed is greater than a predetermined speed and a longitudinal acceleration of the vehicle is less than a predetermined acceleration,
    wherein the predetermined acceleration is less than zero and the predetermined speed is greater than zero, and
    wherein the detection module is configured to detect the occurrence of the sound when the deceleration signal is in the first state.

4. The audio system of claim 3 wherein:
    the deceleration module is configured to set the deceleration signal to a second state when at least one of:
        the vehicle speed is less than the predetermined speed; and
        the longitudinal acceleration of the vehicle is less than the predetermined acceleration, and
    the detection module is configured to not detect the occurrence of the sound when the deceleration signal is in the second state.

5. The audio system of claim 1 further comprising:
    a classification module configured to classify a type of the sound as one of:
        a first type of the sound; and
        a second type of the sound,
    wherein the sound control module is configured to:
        select a first predetermined sound as the predetermined sound when the type of the sound is the first type of the sound; and
        select a second predetermined sound as the predetermined sound when the type of the sound is the second type of the sound.

6. The audio system of claim 5 wherein the classification module is configured to classify the sound based on the pressure measured by the exhaust pressure sensor.

7. The audio system of claim 5 wherein the classification module is configured to classify the sound based on a rate of increase (ROI) of the pressure measured by the exhaust pressure sensor.

8. The audio system of claim 7 wherein the classification module is configured to:
    classify the type of the sound as the first type when the ROI of the pressure measured by the exhaust pressure sensor is greater than a predetermined ROI; and
    classify the type of the sound as the second type when the ROI of the pressure measured by the exhaust pressure sensor is less than the predetermined ROI.

9. The audio system of claim 8 further comprising:
    a base module configured to set a base ROI in the magnitude of the sound to be output within the passenger cabin of the vehicle to:
        a first predetermined ROI when the type of the sound is classified as the first type of the sound; and
        a second predetermined ROI when the type of the sound is classified as the second type of the sound,
        wherein the first predetermined ROI is greater than the second predetermined ROI; and
    wherein the sound control module is configured to increase the magnitude of the sound to be output within the passenger cabin of the vehicle based on the base ROI.

10. The audio system of claim 9 further comprising:
    an adjusting module configured to produce an adjusted ROI by adjusting the base ROI based on an adjustment value,
    wherein the sound control module is configured to increase the magnitude of the predetermined sound to be output within the passenger cabin of the vehicle at the adjusted ROI.

11. The audio system of claim 10 wherein the adjusting module is configured to set the adjusted ROI based on one of:
    a sum of the adjustment value and the base ROI; and
    a product of the adjustment value and the base ROI.

12. The audio system of claim 10 further comprising an adjustment module configured to:
    set the adjustment value to a first predetermined value when a driver selected mode is a first mode; and
    set the adjustment value to a second predetermined value when the driver selected mode is a second mode.

13. The audio system of claim 10 further comprising a learning module configured to set the adjustment value based on a difference between:
    the base ROI; and
    an ROI in sound within the passenger cabin measured using a microphone within the passenger cabin.

14. The audio system of claim 10 further comprising an adjustment module configured to:
    set the adjustment value to a first predetermined value when an opening of an aperture of the passenger cabin is a first opening; and
    set the adjustment value to a second predetermined value when the opening of the aperture of the passenger cabin is a second opening,
    wherein the first predetermined value is greater than the second predetermined value, and
    wherein the first opening is less than the second opening.

15. The audio system of claim 9 further comprising:
    an adjusting module configured to produce an adjusted ROI by adjusting the base ROI based on a first adjustment value and a second adjustment value,
    wherein the sound control module is configured to increase the magnitude of the predetermined sound to be output within the passenger cabin of the vehicle at the adjusted ROI;
    an adjustment module configured to:

set the first adjustment value to a first predetermined value when a driver selected mode is a first mode; and set the first adjustment value to a second predetermined value when the driver selected mode is a second mode; and a learning module configured to set the second adjustment value based on a difference between:

the base ROI; and an ROI in sound within the passenger cabin measured using a microphone within the passenger cabin.

16. The audio system of claim 1 wherein the audio driver module is configured to increase power applied to the speaker in response to the increase in the magnitude.

17. A method of controlling audio within a vehicle, comprising:

detecting an occurrence of a sound when a pressure measured by an exhaust pressure sensor in an exhaust system is greater than a predetermined pressure;

in response to the detection of the sound, increasing a magnitude of a predetermined sound to be output within a passenger cabin of the vehicle; and applying power to a speaker of the passenger cabin of the vehicle based on the predetermined sound.

18. The method of claim 17 further comprising:

classifying a type of the sound as one of:

a first type of the sound; and a second type of the sound;

selecting a first predetermined sound as the predetermined sound when the type of the sound is the first type of the sound; and selecting a second predetermined sound as the predetermined sound when the type of the sound is the second type of the sound.

19. The method of claim 18 wherein the classifying includes classifying the sound based on the pressure measured by the exhaust pressure sensor.

20. The method of claim 18 wherein the classifying includes classifying the sound based on a rate of increase (ROI) of the pressure measured by the exhaust pressure sensor.

\* \* \* \* \*